United States Patent
Jagadish et al.

[11] Patent Number: 5,956,504
[45] Date of Patent: Sep. 21, 1999

[54] METHOD AND SYSTEM FOR COMPRESSING A DATA STREAM IN A DATABASE LOG SO AS TO PERMIT RECOVERY OF ONLY SELECTED PORTIONS OF THE DATA STREAM

[75] Inventors: Hosagrahar Visvesvaraya Jagadish, Berkeley Heights; Ramarao Kanneganti, Jersey City, both of N.J.; Sundararajarao Sudarshan, Bombay, India

[73] Assignee: Lucent Technologies Inc., Murray Hill, N.J.

[21] Appl. No.: 08/607,987

[22] Filed: Mar. 4, 1996

[51] Int. Cl.⁶ .............................. G06F 11/00; G06F 15/00
[52] U.S. Cl. ..................... 395/612; 395/618; 395/617; 395/620; 395/182.13; 395/182.11
[58] Field of Search ........................... 395/612, 618, 395/617, 620, 182.13, 183.11

[56] References Cited

U.S. PATENT DOCUMENTS

| | | | |
|---|---|---|---|
| 4,507,751 | 3/1985 | Gawlick et al. | 364/900 |
| 5,065,311 | 11/1991 | Masai et al. | 364/200 |
| 5,280,611 | 1/1994 | Mohan et al. | 395/600 |
| 5,333,313 | 7/1994 | Heising | 395/600 |
| 5,333,314 | 7/1994 | Masai et al. | 395/600 |
| 5,386,554 | 1/1995 | Nozaki | 395/600 |
| 5,499,367 | 3/1996 | Bamford et al. | 395/600 |
| 5,530,645 | 6/1996 | Chu | 364/419.13 |
| 5,555,371 | 9/1996 | Duyanovich et al. | 395/182.11 |
| 5,574,906 | 11/1996 | Morris | 395/601 |
| 5,581,750 | 12/1996 | Haderle et al. | 395/618 |

*Primary Examiner*—Thomas G. Black
*Assistant Examiner*—Jean R. Homere

[57] ABSTRACT

The invention relates to a system for maintaining a log of incoming records for a database system. Seek points are inserted into the compressed data log in a manner that allows recovery to start from a specified point without a need for decompressing earlier portions of the log. The initial block of data is used as the compression dictionary. A new compression sequence using the same initial compression dictionary is started at each seek point.

5 Claims, 2 Drawing Sheets

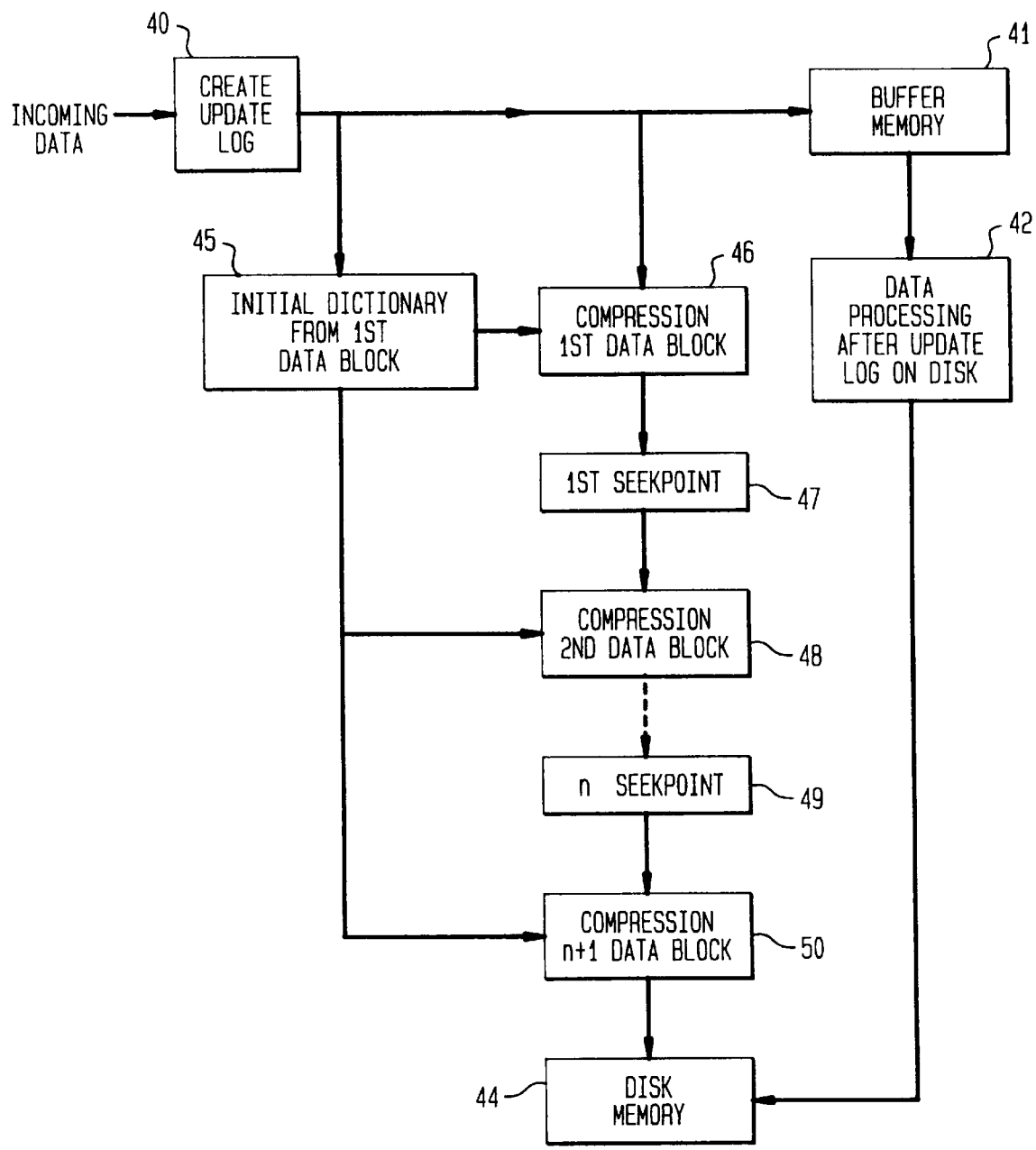

METHOD AND SYSTEM FOR COMPRESSING A DATA STREAM IN A DATABASE LOG SO AS TO PERMIT RECOVERY OF ONLY SELECTED PORTIONS OF THE DATA STREAM

FIELD OF THE INVENTION

This invention relates to database systems, and the like, where incoming data is kept in a log or journal so that entries can be recovered in the event of a power failure or other unanticipated shut down.

BACKGROUND OF THE INVENTION

Databases are expected to provide durable storage of data, resilient against system and power failures. The standard mechanism used to enable recovery from such failures is to create a journal or log of updates made to the database from some known initial or checkpoint state. Before any change to the database is committed or processed, a log record indicating this change must be written out to disk or other non-volatile memory. At recovery time, the log records can be traversed to recapture the effects of all committed updates.

Disk I/O is typically the biggest bottleneck in database performance, and the writing of log records accounts for a significant fraction of the disk I/O in most database systems. In main-memory database systems in particular, log writes may account for nearly all of the disk I/O activity. A reduction in the amount of log information that needs to be recorded will boost overall performance.

SUMMARY OF THE INVENTION

In the system according to the invention the log records are compressed prior to writing out to disk. A small CPU price is paid for the compression and decompression, but this is usually far outweighed by the savings in disk I/O. Compression on a record-by-record basis is usually too short a data stream to be effective. Universal compression algorithms are effective on long data streams but generally must decompress starting at the beginning of the log. This approach is impractical in the typical situation where a long data stream is involved and only a relatively small recent segment need be decompressed. To avoid these problems, seek points are inserted in the system according to the invention in a manner that allows recovery to start from a specified point, without a need for decompressing earlier portions of the log.

At the time that a particular update is committed, the log record corresponding to it must, in compressed form, be completely on disk. In addition, partial compressed log records of additional updates may also have reached the disk due to the granularity of the compression process. With the system for incremental compression according to the invention log records are written out one page at a time, while achieving compression ratios similar to what could have been obtained if the entire log sequence had been compressed at once.

In a typical database system according to the invention, compression of log records is made incrementally from one seek point to the next. The initial block of data is used as the compression dictionary. A new compression sequence using the same initial compression dictionary is started after each seek point. This approach enables independent access to the portion of the log between seek points. Experiments indicate that compressed log records occupy only 10–15% of the space occupied by the uncompressed records. For workloads with a large number of updates, performance increases by almost an order of magnitude can be achieved by compression according to the invention.

In some cases, log records are communicated to remote sites for backup. Compression according to the invention can reduce communication costs in addition to I/O costs, and thus can become more valuable.

BRIEF DESCRIPTION OF THE DRAWINGS

The following drawings together with the detailed specification disclose a preferred embodiment of the invention, wherein:

FIG. 3 is a flow diagram illustrating data flow according to the invention in a database system.

DETAILED DESCRIPTION OF THE INVENTION

Although the invention is more generally applicable, it will be described in the context of the popular windowed Lempel-Ziv algorithm. The Lempel-Ziv algorithm is described in the article, "A Universal Algorithm for Sequential Data Compression", by Jacob Ziv and Abraham Lempel, *IEEE Transactions on Information Theory*, Vol. IT-23, No. 3, May 1977. The idea behind the Lempel-Ziv algorithm is to select a window size of K bytes, and use the latest K bytes of input data to code the next portion of the incoming data. This next portion of input data is coded in accordance with the longest string for which an exact match is found in the current window being used as a "dictionary", provided this is larger than some threshold. If a match is found, the data is replaced by a pointer to the start of the match and an indicator for the length of the match. If a match is not found, the single character remains. The window is then advanced by the number of characters encoded so that it is once more the last K bytes of input already seen.

Thus, data compression is achieved by detecting data sequences that are repetitive within a certain distance. Where a repetitive sequence is detected, the sequence is replaced by a pointer that points to the prior occurrence and the length of the repetitive sequence.

Figure 1:
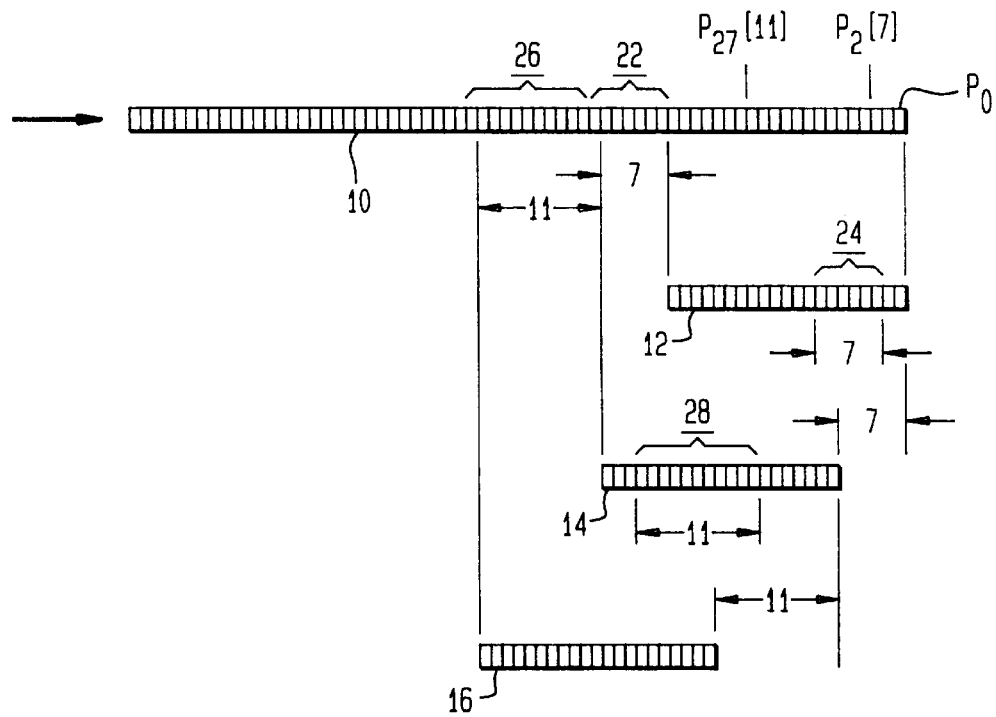
FIG. 1 is a schematic diagram illustrating the operation of the Lempel-Ziv data compression algorithm.

Operation of the Lempel-Ziv algorithm is illustrated in FIG. 1 with respect to a data stream 10 which starts on the right and moves left to right. The initial block of data in data stream 10 is of length k bytes and makes up the initial dictionary 12. In the comparison of the initial dictionary with the following data in the data stream assume that there are seven bytes 22 that are an exact match to seven bytes 24 in the dictionary starting from position P2. Under these circumstances the moving window dictionary moves forward seven places. In other words, the dictionary window advances to include the seven bytes of the prior match and seven bytes fall off the trailing end. After the window has passed the area of the match, the seven bytes are replaced by the pointer to position P2 and by the length seven.

The algorithm continues in this fashion with the window dictionary moving along the data stream according to the length of exact matches and by length/pointer insertions made in place of data matching a moving dictionary sequence. If, for example, after the dictionary is moved seven bytes as a result of the first match, the next eleven bytes 26 in the example are found to be an exact match to eleven bytes 28 in the moving dictionary. These eleven bytes are replaced by a pointer to position P27 with a length indication of eleven. Compression continues in this fashion until the end of the data stream is reached.

Database systems are customarily constructed to include a log or journal to store all of the incoming data on a non-volatile medium before any of the incoming data is processed. In the event of a power failure or other system failure, any received data which has not been processed due to the failure can be recovered from the last part of the journal. Data compression of the journal has not been practical because most data compression techniques require decompression of the data stream from the beginning where the decompression dictionary is found. In large systems involving millions of records, for example, such compression techniques would not be practicable because of the long time required to decompress the entire data stream to recover the most recently received data. On the other hand, compression on record-by-record basis is also impracticable because the records are generally too short to provide meaningful compression since much of the record would be taken up by the dictionary that cannot be compressed.

Figure 2:
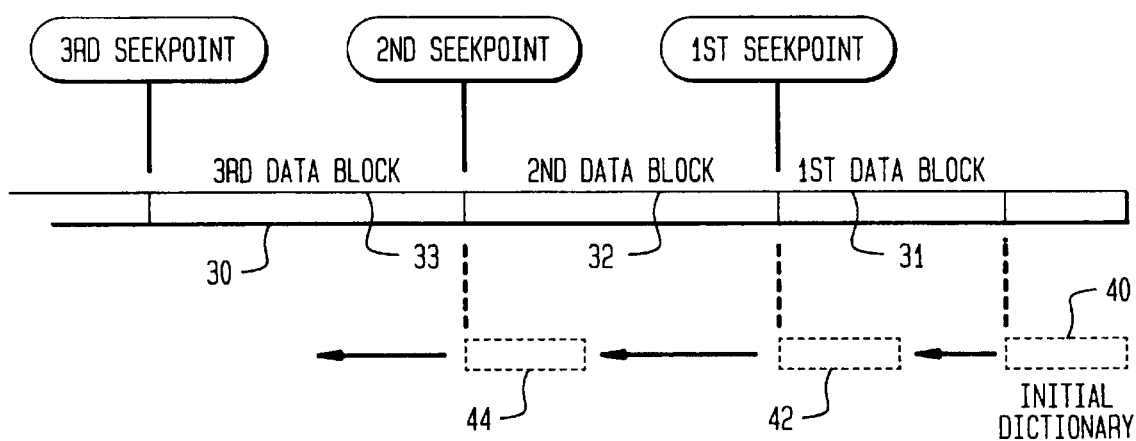
FIG. 2 is a schematic diagram illustrating the data compression technique according to the invention.

In the system according to the invention, data blocks of almost any desired size can be compressed and recovered without decompressing the entire data stream. As shown in FIG. 2, data stream 30 is divided into data blocks 31, 32, 33, etc. A first seek point is located at the end of the first data block prior to the start of the second data block. A seek point is similarly located at the start of each of the other data blocks.

The initial k bytes of the first data block 31 are used as the initial dictionary 40. This initial dictionary is stored in a non-compressed form and is used to initiate the compression of the remainder of the first data block 31 according to the Lempel-Ziv algorithm. At the start of the second data block 32, a dictionary 42, which is the same as initial dictionary 40, is used to start compression of the data block. Since dictionary 42 is the same as initial dictionary 40, there is no need to store dictionary 42. Also, since the initial portion of the second data block is not used as a dictionary, the entire data block can be compressed. Likewise, the same initial dictionary is used as dictionary 44 to start compression of the third data block and all subsequent data blocks. Using the same initial dictionary for all of the data blocks provides compression efficiency nearly as great as that provided by separate initial dictionaries from each data block.

The technique according to the invention has the advantage of having to store only one initial dictionary regardless of the length of the compressed data stream. With this arrangement storage space for dictionaries is reduced and the portion of the data stream that can be compressed is increased. The principal advantage, however, is that decompression recovery can commence at any seek point and decompression from the beginning of the data stream is unnecessary.

FIG. 3 is a data flow diagram of a database system according to the invention. The incoming data is first processed at 40 to create an update log which stores the incoming data in a compressed form according to the order received. The incoming data is stored in a buffer memory 41 until the incoming data in log or journal form is stored in non-volatile disk memory 44.

The first step in creating the update log is step 45 which extracts the initial dictionary from the beginning of the first data block. This initial dictionary is used to compress the remainder of the first data block in step 46. The same initial dictionary is used to compress subsequent data blocks in their entirety in steps 48 and 50. A first seek point 47 is noted at the end of the first data block and a new compression sequence using the initial dictionary stored in step 45 is used for compression of the second data block in step 48. The same sequence is followed for subsequent data blocks in each case using the same initial dictionary stored in step 45 to start the data compression for the data block.

The invention has been described according to a preferred embodiment in a database system but is useful in numerous other applications where data compression can be incorporated. The invention is more particularly defined in the appended claims.

We claim:

1. A method of compressing a data stream so as to permit decompression recovery of only selected portions of the data stream, comprising the steps of:

establishing an initial compression dictionary consisting of initial data in said data stream;

compressing the data stream according to a moving window dictionary starting with said initial compression dictionary by inserting into the data stream the location and length of any exact matches with data sequences in said moving window dictionary;

establishing seek points to identify the start of data blocks in the data stream set for selective recovery decompression;

using said initial dictionary for compression starting at each seek point so that a selected one of said data blocks can be recovered by decompression starting at a seek point and using said initial compression dictionary.

2. A method for incremental compression of data blocks in a data stream, comprising the steps of:

establishing data blocks in the data stream for selected recovery with a seek point identifying the start of each of said data blocks;

establishing an initial dictionary consisting of initial data in the data stream;

compressing each data block according to a moving window dictionary starting with said initial dictionary; and decompression recovery of selected data blocks starting at one of said seek points and using said initial dictionary.

3. A database system comprising:

means for receiving incoming data for storage in records of the database;

means for compressing said incoming data as received to provide compressed data; and means for storing said compressed data on a non-viable medium to provide a journal for said incoming data prior to processing said incoming data in the database system;

whereby, in the event of a power failure or service interruption, selected portions of said incoming data can be recovered by reading from said medium and decompressing selected portions of said stored compressed data.

4. A system according to claim 3 further comprising means for establishing an initial dictionary from the incoming data and for using a moving window dictionary starting with said initial dictionary to compress said incoming data.

5. A system according to claim 4 further comprising means for establishing seek points identifying the location of different data blocks and wherein said means for compressing incoming data compresses data using the same initial dictionary at each such point.

\* \* \* \* \*